United States Patent
Myneni et al.

(10) Patent No.: US 8,903,464 B1
(45) Date of Patent: Dec. 2, 2014

(54) APPARATUS AND PROCESS FOR PASSIVATING AN SRF CAVITY

(75) Inventors: Ganapati Rao Myneni, Yorktown, VA (US); John P. Wallace, Weyers Cave, VA (US)

(73) Assignee: Jefferson Science Associates, LLC, Newport News, VA (US)

( * ) Notice: Subject to any disclaimer, the term of this patent is extended or adjusted under 35 U.S.C. 154(b) by 996 days.

(21) Appl. No.: 12/925,503

(22) Filed: Oct. 23, 2010

(51) Int. Cl.
*H01L 39/24* (2006.01)
*H01J 23/20* (2006.01)
*H05H 7/20* (2006.01)

(52) U.S. Cl.
USPC .......... 505/210; 505/200; 505/473; 505/825; 315/500; 333/99 S; 29/599; 427/457

(58) Field of Classification Search
CPC ............. H05H 7/18; H05H 7/20; H05H 9/00; H01P 7/06; H01P 7/065; H01J 23/18; H01J 23/20; H01J 39/24; H01J 39/2406; H01J 39/2409; H01J 39/249
USPC .......... 505/200, 210, 473, 825; 315/500, 505; 333/227, 99 S; 148/96, 98; 29/599
See application file for complete search history.

(56) References Cited

U.S. PATENT DOCUMENTS

| | | | |
|---|---|---|---|
| 4,857,360 A * | 8/1989 | Halbritter et al. | 427/62 |
| 5,239,157 A * | 8/1993 | Sakano et al. | 219/121.64 |
| 7,151,347 B1 * | 12/2006 | Myneni et al. | 315/500 |

* cited by examiner

*Primary Examiner* — Colleen Dunn
*Assistant Examiner* — Kallambella Vijayakumar

(57) ABSTRACT

An apparatus and process for the production of a niobium cavity exhibiting high quality factors at high gradients is provided. The apparatus comprises a first chamber positioned within a second chamber, an RF generator and vacuum pumping systems. The process comprises placing the niobium cavity in a first chamber of the apparatus; thermally treating the cavity by high temperature in the first chamber while maintaining high vacuum in the first and second chambers; and applying a passivating thin film layer to a surface of the cavity in the presence of a gaseous mixture and an RF field.
Further a niobium cavity exhibiting high quality factors at high gradients produced by the method of the invention is provided.

14 Claims, 1 Drawing Sheet

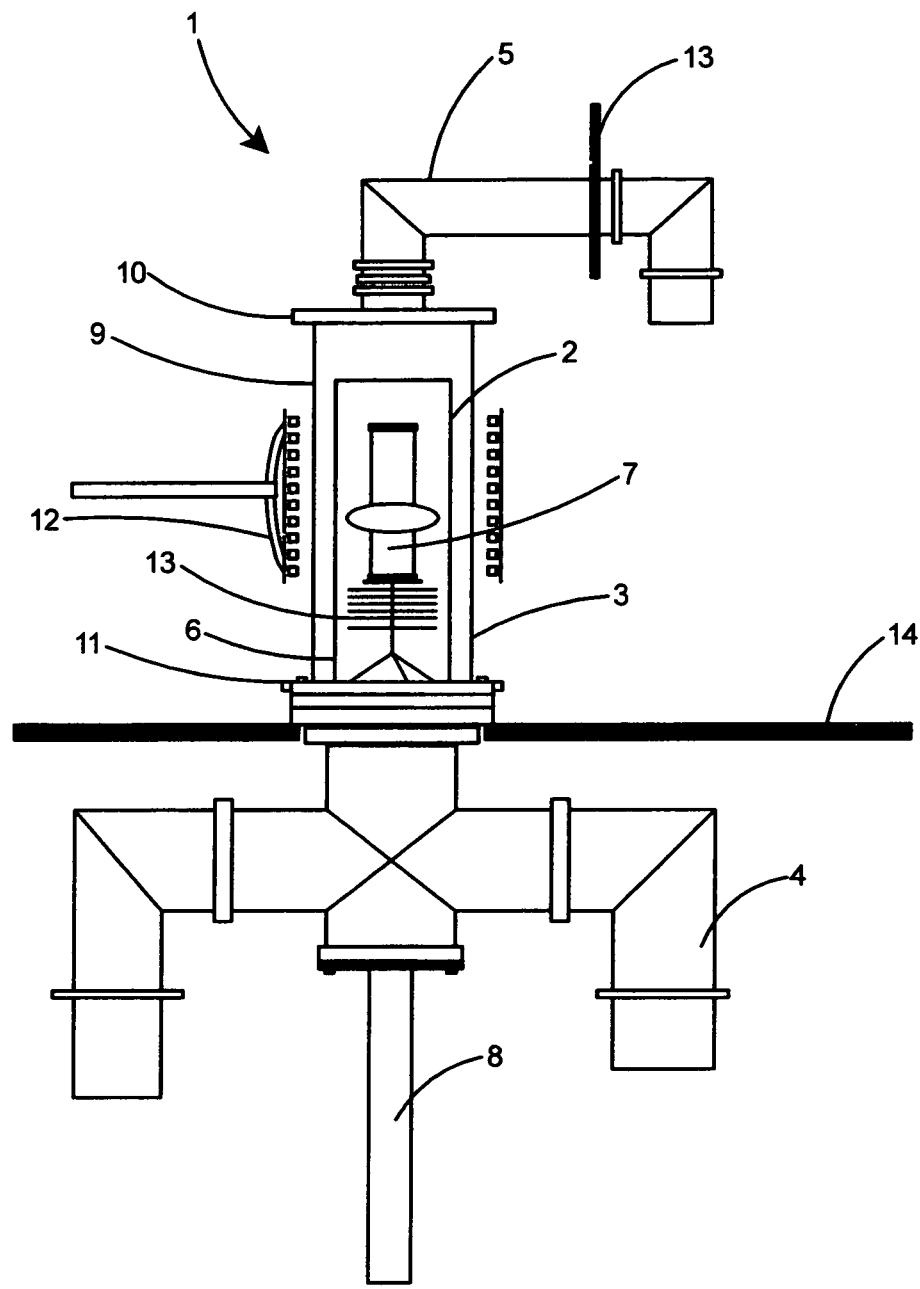

APPARATUS AND PROCESS FOR PASSIVATING AN SRF CAVITY

The United States government may have certain rights to this invention under Management and Operating Contract No.DE-AC05-06OR23177 from Department of Energy.

FIELD OF INVENTION

The present invention relates to an apparatus and method for passivating all surfaces of an SRF (i.e. superconducting radio frequency) cavity particularly passivating cavities comprised of niobium.

BACKGROUND OF THE INVENTION

In the prior art, niobium cavities are desirable for building blocks of particle accelerators, free electron lasers and the like and are well known in the art. Such niobium cavities are fabricated from high purity niobium sheet or cast plate, via deep drawing, e-beam welding and chemical surface cleaning to obtain high accelerating gradients and quality factors. Often the quality factors at high gradients degrade over time for cavities produced by these methods. Such degradation appears to be affected by adherent surface oxide layers, trapped hydrogen and/or interactions between interstitial oxygen and hydrogen in the niobium material. The release of oxygen, hydrogen or the reaction products of these materials results in degradation of the vacuum within the niobium cavities thereby negatively affecting the quality of the output of such cavities.

Thermal treatment of a cavity is useful for obtaining good performance and removing impurities. However, even with thermal treatment under vacuum the cavity surface absorbs residual gas species during cool down to ambient temperatures in a vacuum furnace. Typically a chemical treatment is used following the heat treatment to recover performance. However, as typically performed in the prior art, the chemical treatment has drawbacks as it affords the reintroduction of hydrogen into the cavity and the formation of natural oxides of several nanometers in thickness.

A method of passivating niobium cavities to reduce the negative effects of these gases and impurities is described in U.S. Pat. No. 7,151,347 incorporated herein by reference herein in its entirety. The U.S. Pat. No. 7,151,347 patent describes a multi-step process that includes among others a thermal treatment step and a step of sputtering a passivating layer of niobium nitride onto the surface of the cavity. As the niobium cavity has a complex three dimensional structure with multiple surfaces with varying degrees of accessibility to the sputtering, obtaining a uniform deposition of a layer of niobium nitride over all of the surfaces is difficult utilizing sputtering. Further the depth of the layer of niobium nitride is relevant to the efficacy of the passivacation, e.g. essentially complete coverage is desired but excess deposition impacts the thermal performance of the cavity. Obtaining a uniform, thin layer over all the surface of the cavity is challenging utilizing sputtering.

SUMMARY OF THE INVENTION

The invention includes a process for the production of a niobium cavity exhibiting high quality factors at high gradients. The process comprises placing the niobium cavity in a first chamber housed within a second chamber wherein the first and second chambers are adjacent an RF field generator; thermally treating the cavity by high temperature in the first chamber while maintaining high vacuum in the first and second chambers; and applying a passivating thin film layer to a surface of the cavity in the presence of a gaseous mixture and an RF field.

The invention further includes a niobium cavity exhibiting high quality factors at high gradients produced by the method of the invention.

Additionally the invention includes an apparatus for the production of a niobium cavity exhibiting high quality factors at high gradients. The apparatus comprises a first chamber comprising a material that supports a high vacuum and high temperatures and transmits electromagnetic radiation and a space for receiving a niobium cavity; a second chamber comprising a material that supports a high vacuum and transmits electromagnetic radiation wherein the first chamber is positioned within the second chamber; an RF field generator positioned adjacent the first and the second chambers; and a first and a second vacuum pumping systems. The first vacuum pumping system is in communication with the first chamber and the second vacuum pumping system is in communication with the second chamber.

DESCRIPTION OF THE DRAWINGS

FIG. 1 shows a diagram of an exemplary embodiment of the passivating apparatus of the invention.

DETAILED DESCRIPTION OF INVENTION

The present invention provides an apparatus and method for passivating of a SRF cavity and in particular for passivating a niobium cavity quickly in an optimized processing environment. The apparatus provides for thermal treatment and passivating of a niobium cavity within the apparatus and for use of an RF field to create a plasma for deposition of a thin layer of niobium nitride over all surfaces of the cavity in the presence of a mixture of argon and nitrogen gases. As the layer of niobium nitrate thus deposited is thinner than the penetration depth, superconducting properties of the niobium cavity are maintained.

Referring to FIG. 1 which shows an exemplary embodiment of the passivating apparatus 1 of the invention. The apparatus 1 has a first chamber 2 and a second chamber 3. The first chamber 2 is housed within the second chamber 3. Both the first and the second chambers 2,3 are constructed of materials that support a high vacuum and transmit electromagnetic radiation. The first chamber 2 has an outer wall 6 and the second chamber has an inner wall 9.

In some embodiments, it is desirable to place an insulating material between the outer wall 6 of the first chamber 2 and the inner wall 9 of the second chamber 3. Exemplary suitable insulating materials include, but are not limited to, zirconia, metal foil, ceramics and combinations thereof.

The first chamber 2 is in communication with a first pumping system 4. The first pumping system 4 should be sufficient to evacuate the first chamber 2 to a pressure of about $10^{-6}$ Torr and preferably to pressures lower than $10^{-6}$ Torr. The second chamber 3 is in communication with a second pumping system 5. The second pumping system 5 should be sufficient to evacuate the second chamber 3 to a pressure of about $10^{-6}$ Torr and preferably to pressures lower than $10^{-6}$ Torr. The pumping systems 4,5 are preferably joined to the first and the second chambers 2,3, respectively using metal seals.

The cavity 7 to be passivated is placed with in the first chamber 2. In the exemplary embodiment of FIG. 1, the cavity 7 is introduced and removed from the passivating apparatus via a sample lift 8.

For a passivating apparatus 1 used for the passivating of niobium cavities 7, it is preferable to construct the first chamber 2 of niobium. The inventors believe without wishing to be bound to the theory that constructing the first chamber 2 of niobium when passivating niobium cavities 7 facilitates minimizing contamination. FIG. 1 shows one cavity 7 positioned in the first chamber 2. In some embodiments a plurality of cavities 7 may be placed in the first chamber 2 and processed simultaneously.

Optionally, as shown in FIG. 1, a baffle 13 or a plurality of baffles 13 may be positioned in the first chamber 2 with the cavity 7 to be heat treated and passivated. The baffle(s) 13 should be positioned to reflect radiant energy towards the cavity 7 to be treated.

The passivating apparatus 1 is further provided with an RF field generator 12. The RF field generator is positioned such that upon activating the generator, an RF field is generated in the first and the second chambers 2,3 and the RF field surrounds the sample cavity 7 to be treated positioned in the first chamber 2. The RF field generator has controls that enable it to be turned on and off as desired and adjusted in intensity. Additionally, the RF field should have sufficient strength to generate a plasma in the presence of a gaseous mixture in at least one of the first and the second chambers 2,3.

The RF generator may be utilized for the thermal treatment, for removing impurities and/or annealing of the cavity 7 and is utilized in the passivating step for creating a plasma and for adjusting the temperature of the cavity 7 and first chamber 2 during the application of passivating film. The RF generator should provide for heating to about 2000° C. and provide for adjustment of temperature. An induction coil is exemplary of a suitable RF generator.

The passivating apparatus 1 will typically include one or more cooling systems. In the embodiment shown in FIG. 1, two cooling systems 10, 11 are provided. The second chamber 3 is positioned such that the first chamber 2 is within the second chamber 3. The second chamber 3 is typically operated at ambient temperature or alternatively at a temperature substantially cooler than the first chamber 2 when the first chamber 2 is heated. The cooling systems 10, 11 and optionally insulation may be employed to maintain the temperature of the second chamber 3. Additionally, it is desirable that the cooling systems 10, 11 be position to provide cooling to the seals at the interface between the pumping systems 4,5 and the first and the second chambers 2,3. Coolers 10, 11 are exemplary of cooling systems suitable for use with the passivating apparatus 1. Other configurations and/or number of coolers may likewise be satisfactory so long as they provide cooling for the passivating apparatus 1 and/or selected components of the passivating apparatus 1 and do not impede the establishment of a vacuum and/or electromagnetic field in the first and second chambers 2,3.

The first chamber 2 is in communication with a gas introduction system (not shown). For passivating a niobium cavity 7 with a thin layer of niobium nitride, a mixture of nitrogen gas and argon gas is introduced into the first chamber 2. The gas introduction system should permit the introduction of the gaseous mixture in to the first chamber 2 at a pressure of a few milli Torr. One skilled in the art is familiar with suitable gas introduction systems.

Optionally, the passivating apparatus 1 is equipped with one or more supports 13, 14. The supports 13, 14 shown in FIG. 1 are exemplary and other configurations and/or numbers of supports may be likewise suitable as the function of the supports is to maintain the passivating apparatus 1 in the desired position.

The invention further includes a process for the production of a niobium cavity exhibiting high quality factors at high gradients. The process comprises utilizing the passivating apparatus described herein.

The niobium cavity to be passivated is placed in the first chamber of the passivating apparatus. In the exemplary embodiment shown in FIG. 1 the cavity 7 is introduced into the first chamber 2 via the sample lift 8.

The niobium cavity is thermally treated by heating the first chamber to a temperature of about 1200° C. to about 1400° C. In one exemplary embodiment, a vacuum of about $10^{-6}$ Torr is maintained in the first and the second chambers 2,3 during the thermal treatment. A high vacuum should be maintained in both chambers during the thermal treatment, but the precise value of the vacuum may be varied depending on the specific conditions and nature of the cavity 7 to be treated. Further, the vacuum in the first chamber 2 and the second chamber 3 may be about the same pressure or alternatively the pressure in the second chamber 3 may be lower than in the first chamber 2. For an exemplary embodiment of a niobium cavity made of ingot niobium the cavity is typically heated for about 2 hours. The time may vary depending on the specific conditions and nature of the cavity. For embodiments in which the first chamber is constructed of niobium, residual gases are removed from both the niobium cavity being treated and the walls of the first chamber which limits residual gases on the walls of the first chamber available for potential reintroduction to the cavity upon cooling.

Typically, following the thermal treatment the cavity 7 and the first chamber 2 are cooled before the passivating step.

Upon completion of the thermal treatment, a mixture of gases is introduced into the first chamber 2 for passivating the cavity 7. In a preferred embodiment for passivating a niobium cavity 7 a mixture of nitrogen and argon gas is used. One exemplary embodiment the gaseous mixture is about 10% to about 15% nitrogen in argon. Typically the gas pressure of the gaseous mixture in the first chamber 2 is a few milli Torr. The nitrogen and argon are preferably of a high purity to avoid introduction of contaminants. The gaseous mixture is allowed to surround the surfaces of the cavity 7 to be treated.

An RF field is applied to the first and second chambers 2,3 which in the presence of the gaseous mixture in the first chamber 2 creates a plasma in the first chamber 2. The plasma provides for the reaction of the nitrogen with niobium at the surface of the cavity 7 to form a thin film layer of niobium nitrate on the surfaces of the cavity 7. The RF field should be adjusted to a field strength and/or applied for a time such that a thin film layer of less than about 40 nm is deposited on the surface of the cavity 7. Preferably, during the deposition of the thin film layer, the cavity 7 and first chamber are maintained at a temperature less than 1200° C.

The deposition of niobium nitride from a plasma facilitates not only obtaining a thin film layer but also facilitates uniform deposition of the thin film of niobium nitride over the entire complex surface of the cavity.

The invention further includes a niobium cavity exhibiting high quality factors at high gradients produced by the method described herein. The niobium cavity has a passivating thin film layer of niobium nitride of 40 nm or less. The niobium cavity may be fabricated from cast, sheet or ingot high purity niobium and is fabricated into the cavity configuration prior to the treatment described herein.

What is at present considered the preferred embodiment and alternative embodiments of the present invention has been shown and described herein. It will be obvious to those skilled in the art that various changes and modifications may be made therein without departing from the scope of the invention as defined by the appended claims.

What is claimed is:

1. A process for the production of a niobium cavity exhibiting high quality factors at high gradients comprising:
   a. placing the niobium cavity in a first chamber housed within a second chamber wherein the first and second chambers are adjacent an RF field generator;
   b. thermally treating the niobium cavity by high temperature in the first chamber while maintaining high vacuum in the first and the second chambers; and
   c. applying a passivating thin film layer to a surface of the cavity in the presence of a gaseous mixture and an RF field.

2. The process of claim 1 wherein the first chamber comprises niobium.

3. The process of claim 1 wherein the second chamber comprises a material that supports high vacuum and transmits electromagnetic energy.

4. The process of claim 1 wherein during the thermal treatment the first chamber is heated to 1200° C. to 1400° C.

5. The process of claim 1 wherein during the thermal treatment the first and second chambers are evacuated to a vacuum of at least $10^{-6}$ Torr.

6. The process of claim 1 wherein during the applying of the passivating thin film the cavity and first chamber are maintained at a temperature less than 1200° C.

7. The process of claim 1 wherein the gaseous mixture is 10% to 15% nitrogen in argon.

8. The process of claim 1 wherein the thin film layer is a niobium nitride thin film of 40 nm or less in thickness.

9. The process of claim 1 further comprising placing a plurality of niobium cavities in the first chamber.

10. The process of claim 1 including adjusting the intensity of said RF field to generate a plasma in the presence of the gaseous mixture in at least one of the first and second chambers.

11. The process of claim 1 including applying said RF field for a length of time to generate said passivating thin film layer of niobium nitride on the surface of said niobium cavity.

12. The process of claim 11 wherein said length of time is at least 2 hours.

13. A process for the production of a niobium cavity exhibiting high quality factors at high gradients comprising:
   a. providing a niobium cavity, a first chamber housed within a second chamber, and an RF generator adjacent said first chamber and said second chamber;
   b. placing said niobium cavity in said first chamber;
   c. evacuating said first and second chambers to at least $10^{-6}$ Torr;
   d. introducing a gaseous mixture of nitrogen gas and argon gas into said first chamber;
   e. generating an RF field with said RF generator;
   f. adjusting the intensity of said RF field to generate a plasma in the presence of said gaseous mixture in said first chamber;
   g. heating said first chamber to a temperature of 1200° C. to 1400° C.; and
   h. maintaining said gaseous mixture of nitrogen gas and argon gas until a passivating thin film layer of 40 nm or less is developed on said surface of said niobium cavity.

14. The process of claim 13 wherein the gaseous mixture is 10% to 15% nitrogen in argon.

* * * * *